US011581034B1

(12) United States Patent
Chi

(10) Patent No.: US 11,581,034 B1
(45) Date of Patent: Feb. 14, 2023

(54) SENSE AMPLIFICATION CIRCUIT AND METHOD OF READING OUT DATA

(71) Applicant: CHANGXIN MEMORY TECHNOLOGIES, INC., Hefei (CN)

(72) Inventor: Sungsoo Chi, Hefei (CN)

(73) Assignee: GHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/818,110

(22) Filed: Aug. 8, 2022

Related U.S. Application Data

(63) Continuation of application No. PCT/CN2022/097189, filed on Jun. 6, 2022.

(30) Foreign Application Priority Data

Aug. 27, 2021 (CN) .......................... 202110998264.0

(51) Int. Cl.
*G11C 11/4091* (2006.01)
(52) U.S. Cl.
CPC ................ *G11C 11/4091* (2013.01)
(58) Field of Classification Search
CPC .................................................. G11C 11/4091
USPC .......................................................... 365/207
See application file for complete search history.

(56) References Cited

U.S. PATENT DOCUMENTS

| 7,382,672 B2 * | 6/2008 | Barth, Jr. ............ G11C 11/4091 |
| | | 365/207 |
| 10,224,093 B2 | 3/2019 | Kim et al. |
| 10,726,886 B2 | 7/2020 | Choi et al. |
| 11,024,365 B1 * | 6/2021 | Seo ..................... G11C 11/4091 |

FOREIGN PATENT DOCUMENTS

| CN | 109767799 A | 5/2019 |
| CN | 112767975 A | 5/2021 |
| CN | 112992200 A | 6/2021 |

OTHER PUBLICATIONS

International Search Report cited in PCT/CN2022/097189 dated Aug. 25, 2022, 19 pages.

* cited by examiner

*Primary Examiner* — Anthan Tran
(74) *Attorney, Agent, or Firm* — Cooper Legal Group, LLC

(57) ABSTRACT

The present disclosure provides a sense amplification circuit and a method of reading out data, including: a first PMOS transistor; a first NMOS transistor; a second PMOS transistor; a second NMOS transistor; a first control MOS transistor configured to provide a bias voltage to the first PMOS transistor according to a control signal; a second control MOS transistor configured to provide the bias voltage to the second PMOS transistor according to the control signal; a first offset cancellation MOS transistor configured to electrically connect an initial bit line to a first complementary readout bit line according to an offset cancellation signal; and a second offset cancellation MOS transistor configured to electrically connect an initial complementary bit line to a first readout bit line according to the offset cancellation signal.

15 Claims, 8 Drawing Sheets

SENSE AMPLIFICATION CIRCUIT AND METHOD OF READING OUT DATA

CROSS-REFERENCE TO RELATED APPLICATIONS

This is a continuation of International Application No. PCT/CN2022/097189, filed on Jun. 6, 2022, which claims the priority to Chinese Patent Application 202110998264.0, titled "SENSE AMPLIFICATION CIRCUIT AND METHOD OF READING OUT DATA" and filed on Aug. 27, 2021. The entire contents of International Application No. PCT/CN2022/097189 and Chinese Patent Application 202110998264.0 are incorporated herein by reference.

TECHNICAL FIELD

The present disclosure relates to, but is not limited to, a sense amplification circuit and a method of reading out data.

BACKGROUND

A dynamic random access memory (DRAM) writes data through electric charge in a cell capacitor; the cell capacitor is connected to a bit line and a complementary bit line. In the DRAM, when a read operation or a refresh operation is performed, a readout amplifier reads and amplifies a voltage difference between the bit line and the complementary bit line.

Semiconductor devices forming a readout amplifier may have different device characteristics (e.g., threshold voltage) due to factors such as a process change and temperature. Different device characteristics may cause an offset noise in the readout amplifier, while the offset noise reduces the effective readout margin of the readout amplifier and reduces the performance of the DRAM.

The applicant found that in the current process of eliminating the offset noise in the DRAM, the bit line is electrically connected to a complementary readout bit line, the complementary bit line is electrically connected to a readout bit line, and therefore, the offset noise is canceled through the voltage difference between the bit line and the complementary bit line. However, since a gate of a PMOS transistor in a sense amplification circuit is connected to the readout bit line and the complementary readout bit line, respectively, it is easy to cause voltage fluctuations of the readout bit line and the complementary readout bit line, thereby affecting the voltage of the bit line and the voltage of the complementary bit line, reducing the readout accuracy of the DRAM, and reducing the performance of the DRAM.

SUMMARY

An overview of the subject matter described in detail in the present disclosure is provided below, which is not intended to limit the protection scope of the claims.

The present disclosure provides a sense amplification circuit and a method of reading out data.

A first aspect of the present disclosure provides a sense amplification circuit, provided between two adjacent memory arrays, and including: a first PMOS transistor, provided with a gate connected to a second readout bit line, a drain connected to a first complementary readout bit line, and a source connected to a first signal terminal; a first NMOS transistor, provided with a gate connected to an initial bit line, a drain connected to the first complementary readout bit line, and a source connected to a second signal terminal, wherein the initial bit line is connected to one of the two adjacent memory arrays; a second PMOS transistor, provided with a gate connected to a second complementary readout bit line, a drain connected to a first readout bit line, and a source connected to the first signal terminal; a second NMOS transistor, provided with a gate connected to an initial complementary bit line, a drain connected to the first readout bit line, and a source connected to the second signal terminal, wherein the initial complementary bit line is connected to the other of the two adjacent memory arrays, the first signal terminal is configured to receive a first level signal, and the second signal terminal is configured to receive a second level signal; a first control MOS transistor, provided with a source connected to the second readout bit line, a gate for receiving a control signal, and a drain for receiving a bias voltage, and configured to provide the bias voltage to the first PMOS transistor according to the control signal; a second control MOS transistor, provided with a source connected to the second complementary readout bit line, a gate for receiving the control signal, and a drain for receiving the bias voltage, and configured to provide the bias voltage to the second PMOS transistor according to the control signal; a first offset cancellation MOS transistor, provided with a source connected to the initial bit line, a drain connected to the first complementary readout bit line, and a gate for receiving an offset cancellation signal, and configured to electrically connect the initial bit line to the first complementary readout bit line according to the offset cancellation signal; and a second offset cancellation MOS transistor, provided with a source connected to the initial complementary bit line, a drain connected to the first readout bit line, and a gate for receiving the offset cancellation signal, and configured to electrically connect the initial complementary bit line to the first readout bit line according to the offset cancellation signal.

A second aspect of the present disclosure provides a method of reading out data, applied to the sense amplification circuit according to the first aspect, including: a precharge stage, an offset cancellation stage, a charge sharing stage, a sense amplification stage, and a reset stage performed in sequence; in the precharge stage and the reset stage, precharging an initial bit line, a first readout bit line, a second readout bit line, an initial complementary bit line, a first complementary readout bit line, and a second complementary readout bit line in the sense amplification circuit to a precharge voltage; in the offset cancellation stage, providing a bias voltage to a first PMOS transistor and a second PMOS transistor in the sense amplification circuit for eliminating a device difference between the first PMOS transistor and the second PMOS transistor and eliminating a device difference between a first NMOS transistor and a second NMOS transistor; in the charge sharing stage, reading out a voltage of a target memory cell to the initial bit line, and reading out a voltage of a target complementary memory cell to the initial complementary bit line; and in the sense amplification stage, pulling up a voltage higher than the precharge voltage in the initial bit line and the initial complementary bit line to a voltage corresponding to a first level signal, and pulling down a voltage lower than the precharge voltage in the initial bit line and the initial complementary bit line to a voltage corresponding to a second level signal.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

Figure 1:
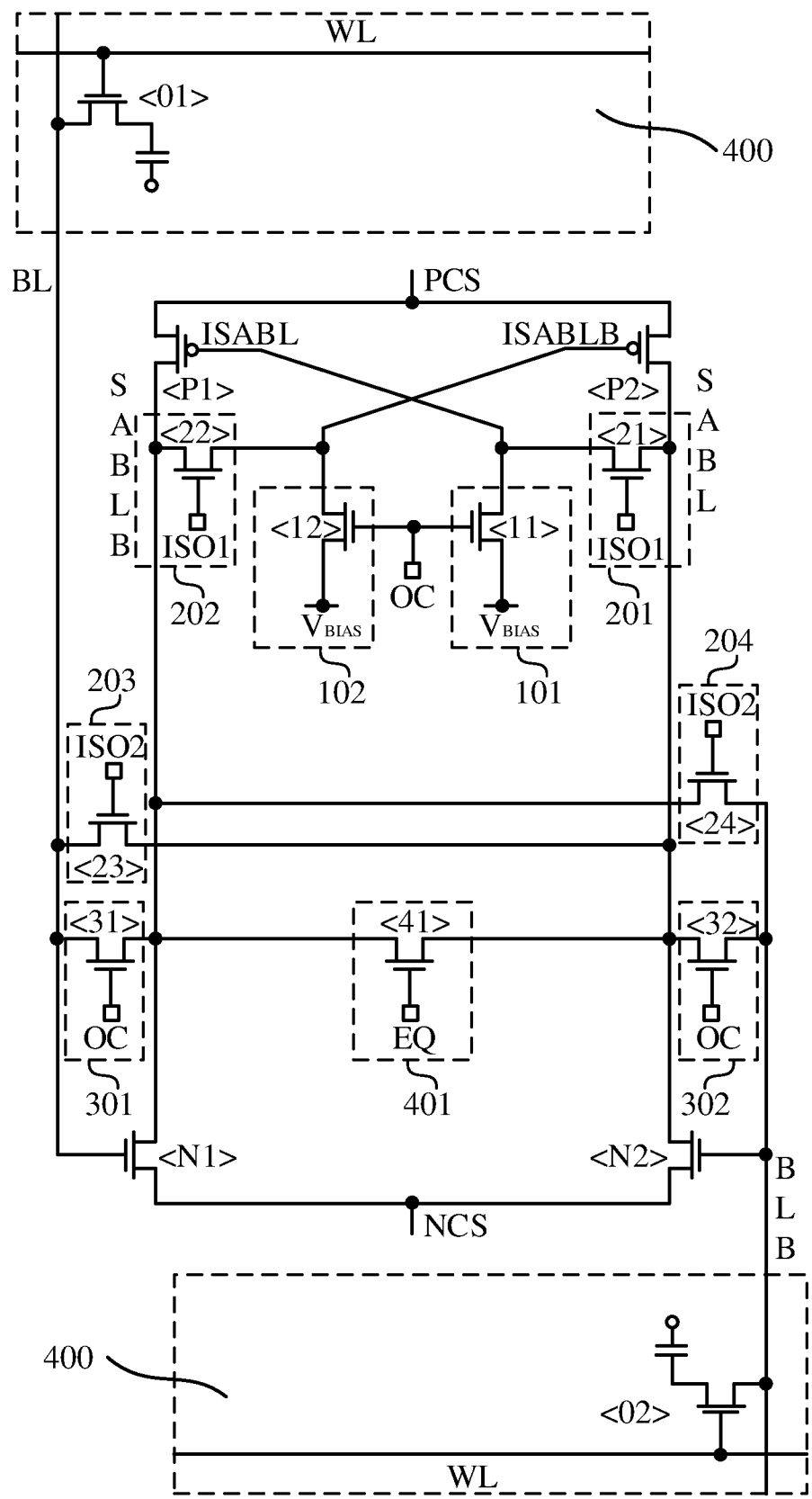
FIG. 1 is a schematic diagram of a circuit structure of a sense amplification circuit according to one embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the current process of eliminating an offset noise in a DRAM, a bit line is electrically connected to a complementary readout bit line, a complementary bit line is electrically connected to a readout bit line, and therefore, the offset noise is canceled through a voltage difference between the bit line and the complementary bit line. However, since a gate of a PMOS transistor in a sense amplification circuit is connected to the readout bit line and the complementary readout bit line, respectively, it is easy to cause voltage fluctuations of the readout bit line and the complementary readout bit line, thereby affecting the voltage of the bit line and the voltage of the complementary bit line, reducing the readout accuracy of the DRAM, and reducing the performance of the DRAM. Therefore, how to stably cancel the offset noise in the sense amplification circuit while avoiding the voltage fluctuations of the bit line and the complementary bit line is an urgent problem to be solved at present.

One embodiment of the present disclosure provides a sense amplification circuit provided between two adjacent memory arrays, including: a first PMOS transistor provided with a gate connected to a second readout bit line, a drain connected to a first complementary readout bit line, and a source connected to a first signal terminal; a first NMOS transistor provided with a gate connected to an initial bit line, a drain connected to the first complementary readout bit line, and a source connected to a second signal terminal, where the initial bit line is connected to one of the two adjacent memory arrays; a second PMOS transistor provided with a gate connected to a second complementary readout bit line, a drain connected to a first readout bit line, and a source connected to the first signal terminal; a second NMOS transistor provided with a gate connected to an initial complementary bit line, a drain connected to the first readout bit line, and a source connected to the second signal terminal, where the initial complementary bit line is connected to the other of the two adjacent memory arrays, the first signal terminal is configured to receive a first level signal, and the second signal terminal is configured to receive a second level signal; a first control MOS transistor provided with a source connected to the second readout bit line, a gate for receiving a control signal, and a drain for receiving a bias voltage, and configured to provide the bias voltage to the first PMOS transistor according to the control signal; a second control MOS transistor provided with a source connected to the second complementary readout bit line, a gate for receiving the control signal, and a drain for receiving the bias voltage, and configured to provide the bias voltage to the second PMOS transistor according to the control signal; a first offset cancellation MOS transistor provided with a source connected to the initial bit line, a drain connected to the first complementary readout bit line, and a gate for receiving an offset cancellation signal, and configured to electrically connect the initial bit line to the first complementary readout bit line according to the offset cancellation signal; and a second offset cancellation MOS transistor provided with a source connected to the initial complementary bit line, a drain connected to the first readout bit line, and a gate for receiving the offset cancellation signal, and configured to electrically connect the initial complementary bit line to the first readout bit line according to the offset cancellation signal.

FIG. 1 is a schematic diagram of a circuit structure of a sense amplification circuit according to this embodiment. The sense amplification circuit provided in each embodiment of the present disclosure is further described below in detail with reference to the accompanying drawings, and the details are as follows:

Referring to FIG. 1, the sense amplification circuit, provided between two adjacent memory arrays 400, includes:

The first PMOS transistor <P1> is provided with the gate connected to the second readout bit line ISABL, the drain connected to the first complementary readout bit line SABLB, and the source connected to the first signal terminal, where the first signal terminal is configured to receive the first level signal (positive cell storing signal (PCS)).

The first NMOS transistor <N1> is provided with the gate connected to the initial bit line BL, the drain connected to the first complementary readout bit line SABLB, and the source connected to the second signal terminal, where the second signal terminal is configured to receive the second level signal (negative cell storing signal (NCS)).

In this embodiment, the voltage of the first level signal PCS is greater than the voltage of the second level signal NCS. That is, the first level signal PCS is at a high level corresponding to logic "1", and the second level signal NCS is at a low level corresponding to logic "0".

The second PMOS transistor <P2> is provided with the gate connected to the second complementary readout bit line ISABLB, the drain connected to the first readout bit line SABL, and the source connected to the first signal terminal.

The second NMOS transistor <N2> is provided with the gate connected to the initial complementary bit line BLB, the drain connected to the first readout bit line SABL, and the source connected to the second signal terminal.

For the initial bit line BL and the initial complementary bit line BLB, the initial bit line BL is connected to the memory cell in one of the adjacent memory arrays 400, and the initial complementary bit line is connected to the memory cell in the other of the adjacent memory arrays 400.

In this embodiment, referring to FIG. 1, the initial bit line BL is connected to a first memory cell through a first switch transistor <01>, and the initial complementary bit line BLB is connected to a second memory cell through a second switch transistor <02>.

For the first switch transistor <01> and the second switch transistor <02>, the first switch transistor <01> is provided with a gate connected to a word line WL, a source connected to the initial bit line BL, and a drain connected to the first memory cell, and the second switch transistor <02> is provided with a gate connected to the word line WL, a source connected to the initial complementary bit line BLB, and a drain connected to the second memory cell.

The word line WL is turned on based on a row selection signal. When the word line WL is turned on, the switch transistor connected to the word line WL is turned on, an electrical charge in the memory cell is shared onto the initial bit line BL or the initial complementary bit line BLB, and the initial bit line BL or the initial complementary bit line BLB is turned on based on a column selection signal. When the initial bit line BL or the initial complementary bit line BLB is turned on, a memory reads out data.

The first control MOS transistor <11> is provided with the source connected to the second readout bit line ISABL, the gate for receiving the control signal, and the drain for receiving the bias voltage VBIAS, and is configured to provide the bias voltage to the first PMOS transistor <P1> according to the control signal.

The second control MOS transistor <12> is provided with the source connected to the second complementary readout bit line ISABLB, the gate for receiving the control signal, and the drain for receiving the bias voltage VBIAS, and is configured to provide the bias voltage VBIAS to the first NMOS transistor <N1> according to the control signal.

The first offset cancellation MOS transistor <31> is provided with the source connected to the initial bit line BL, the drain connected to the first complementary readout bit line SABLB, and the gate for receiving the offset cancellation signal (OC), and is configured to electrically connect the initial bit line BL to the first complementary readout bit line SABLB according to the offset cancellation signal OC.

The second offset cancellation MOS transistor <32> is provided with the source connected to the initial complementary bit line BLB, the drain connected to the first readout bit line SABL, and the gate for receiving the offset cancellation signal OC, and is configured to electrically connect the initial complementary bit line BLB to the first readout bit line SABL according to the offset cancellation signal OC.

After the first control MOS transistor <11> and the second control MOS transistor <12> are turned on based on the control signal, the bias voltage VBIAS is provided to the gate of the first PMOS transistor <P1> and the gate of the second PMOS transistor <P2>, the first PMOS transistor <P1> is turned on based on the bias voltage VBIAS, the first signal terminal is electrically connected to the first complementary readout bit line SABLB, the first level signal PCS is transmitted to the first complementary readout bit line SABLB, the second PMOS transistor <P2> is turned on based on the bias voltage VBIAS, the first signal terminal is electrically connected to the first readout bit line SABL, and the first level signal PCS is transmitted to the first readout bit line SABL, thereby canceling offsets of the PMOS transistors. After the first offset cancellation MOS transistor <31> and the second offset cancellation MOS transistor <32> are turned on based on the offset cancellation signal OC, the initial bit line BL and the first complementary readout bit line SABLB are electrically connected and share a voltage, the initial complementary bit line BLB and the first readout bit line SABL are electrically connected and share a voltage, the voltage of the initial bit line BL serves as a gate voltage of the first NMOS transistor <N1> for turning on the first NMOS transistor <N1>, the second signal terminal is electrically connected to the first complementary readout bit line SABLB, the second level signal NCS is transmitted to the first complementary readout bit line SABLB, the voltage of the initial complementary bit line BL serves as a gate voltage of the second NMOS transistor <N2> for turning on the second NMOS transistor <N2>, the second signal terminal is electrically connected to the first readout bit line SABL, and the second level signal NCS is transmitted to the first readout bit line SABL, thereby canceling offsets of the NMOS transistors. The first PMOS transistor <P1> and the second PMOS transistor <P2> are turned on based on a stable bias voltage VBIAS, i.e., keeping the voltage of the first readout bit line SABL and the voltage of the first complementary readout bit line SABLB stable, thereby further stabilizing the voltage of the initial bit line BL and the voltage of the initial complementary bit line BLB, avoiding voltage fluctuations of the bit line and the complementary bit line, and stably canceling the offset noise in the sense amplification circuit.

In one example, in the circuit as shown in FIG. 1, the control signal is the same as the offset cancellation signal OC. That is, the first control MOS transistor <11>, the second control MOS transistor <12>, the first offset cancellation MOS transistor <31>, and the second offset cancellation MOS transistor <32> are all turned on based on the offset cancellation signal OC. By configuring the control signal to be the same as the offset cancellation signal OC, the first control MOS transistor <11>, the second control MOS transistor <12>, the first offset cancellation MOS transistor <31>, and the second offset cancellation MOS transistor <32> are synchronously controlled to cancel the offset of the sense amplification circuit.

In one example, as shown in FIG. 1, the control signal includes a first control signal and a second control signal, where the first control MOS transistor <11> is turned on based on the first control signal, and the second control MOS transistor <12> is turned on based on the second control signal. That is, the first control MOS transistor <11> provides the bias voltage VBIAS to the first PMOS transistor <P1> based on the first control signal, and the second control MOS transistor <12> provides the bias voltage VBIAS to the second PMOS transistor <P2> based on the second control signal. The first control subcircuit and the second control subcircuit are respectively controlled through different control signals, thereby further achieving accurate control to the control module 100. The first control MOS transistor <11> and the second control MOS transistor <12> are respectively controlled through different control signals, thereby further achieving accurate control to the sense amplification circuit.

In one example, as shown in FIG. 1, the first control MOS transistor <11> and the second control MOS transistor <12> can also be implemented only through one MOS transistor. That is, the bias voltage VBIAS is synchronously provided to the first PMOS transistor <P1> and the second PMOS transistor <P2> through the same MOS transistor. The bias voltage VBIAS is provided by the same control subcircuit, thereby reducing the layout area of the sense amplification circuit, and facilitating the improvement of the integration level of the memory.

In this embodiment, as shown in FIG. 1, the sense amplification circuit further includes: a first isolation subcircuit 201 provided with one end connected to the first readout bit line SABL and the other end connected to the second readout bit line ISABL, and configured to electrically connect the first readout bit line SABL to the second readout bit line ISABL according to a first isolation signal (ISO1); and a second isolation subcircuit 202 provided with one end connected to the first complementary readout bit line SABLB and the other end connected to the second complementary readout bit line ISABLB, and configured to electrically connect the first complementary readout bit line SABLB to the second complementary readout bit line ISABLB according to the first isolation signal (ISO1).

Exemplarily, as shown in FIG. 1, the first isolation subcircuit 201 includes a first isolation MOS transistor <21> provided with a source connected to the first readout bit line SABL, a drain connected to the second readout bit line ISABL, and a gate for receiving the first isolation signal ISO1; and the second isolation subcircuit 202 includes a second isolation MOS transistor <22> provided with a source connected to the first complementary readout bit line SABLB, a drain connected to the second complementary readout bit line ISABLB, and a gate for receiving the first isolation signal ISO1.

The sense amplification circuit provides the first isolation signal ISO1 in the precharge stage to precharge the second readout bit line ISABL and the second complementary readout bit line ISABLB, and provides the first isolation signal ISO1 in the sense amplification stage, so that the gate of the first PMOS transistor <P1> is connected to the first readout bit line SABL, and the gate of the first PMOS transistor <P1> is connected to the first complementary readout bit line SABLB.

As shown in FIG. 1, for the first PMOS transistor <P1> and the first NMOS transistor <N1>, since the connection relationship between the gate of the first PMOS transistor <P1> and the gate of the first NMOS transistor <N1> is the same, that is, when the first PMOS transistor <P1> or the first NMOS transistor <N1> is turned on based on different levels of the second readout bit line ISABL, there is only one MOS transistor that is turned on in the first PMOS transistor <P1> and the first NMOS transistor <N1>; and for the second PMOS transistor <P2> and the second NMOS transistor <N2>, since the connection relationship between the gate of the second PMOS transistor <P2> and the gate of the second NMOS transistor <N2> is the same, that is, when the second PMOS transistor <P2> or the second NMOS transistor <N2> is turned on based on different levels of the second complementary bit line ISABLB, there is only one MOS transistor that is turned on in the second PMOS transistor <P2> and the second NMOS transistor <N2>.

As shown in FIG. 1, after the second PMOS transistor <P2> is turned on, the first signal terminal is communicated with the first readout bit line SABL, such that the first readout bit line SABL is pulled up to the first level signal PCS, the initial bit line BL is pulled up to the first level signal PCS, and the data read out by the memory through the initial bit line BL is at a high level of the first level signal PCS corresponding to logic "1"; after the first NMOS transistor <N1> is turned on, the second signal terminal is communicated with the first complementary readout bit line SABLB, such that the first complementary readout bit line SABLB is pulled down to the second level signal NCS, the initial complementary bit line BLB is pulled down to the second level signal NCS, and the data read out by the memory through the initial complementary bit line BLB is at a low level of the second level signal NCS corresponding to logic "0"; and after the first PMOS transistor <P1> is turned on, the first signal terminal is communicated with the first complementary readout bit line SABLB, such that the first complementary readout bit line SABLB is pulled up to the first level signal PCS, the initial complementary bit line BLB is pulled up to the first level signal PCS, and the data read out by the memory through the initial complementary bit line BLB is at a high level of the first level signal PCS corresponding to logic "1"; and after the second NMOS transistor <N2> is turned on, the second signal terminal is communicated with the first readout bit line SABL, such that the first readout bit line SABL is pulled down to the second level signal NCS, the initial bit line BL is pulled down to the second level signal NCS, and the data read out by the memory through the initial bit line BL is at a low level of the second level signal NCS corresponding to logic "0".

In this embodiment, as shown in FIG. 1, the sense amplification circuit further includes: a third isolation subcircuit 203 provided with one end connected to the initial bit line BL and the other end connected to the first readout bit line SABL, and configured to electrically connect the initial bit line BL to the first readout bit line SABL according to a second isolation signal (ISO2); and a fourth isolation subcircuit 204 provided with one end connected to the initial complementary bit line BLB and the other end connected to the first complementary readout bit line SABLB, and configured to electrically connect the initial complementary bit line BLB to the first complementary readout bit line SABLB according to the second isolation signal (ISO2).

As shown in FIG. 1, the third isolation subcircuit 203 includes a third isolation MOS transistor <23> provided with a source connected to the initial bit line BL, a drain connected to the first readout bit line SABL, and a gate for receiving the second isolation signal (ISO2). The fourth isolation subcircuit 204 includes a fourth isolation MOS transistor <24> provided with a source connected to the initial complementary bit line BLB, a drain connected to the first complementary readout bit line SABLB, and a gate for receiving the second isolation signal (ISO2).

The sense amplification circuit provides the second isolation signal ISO2 in the offset cancellation stage and the amplification stage, so as to realize the charge sharing between the initial bit line BL and the first readout bit line SABL, and between the initial complementary bit line BLB and the first complementary bit line SABLB.

In this embodiment, as shown in FIG. 1, the sense amplification circuit further includes: an equalization subcircuit 401 provided with one end connected to the first readout bit line SABL and the other end connected to the first complementary readout bit line SABLB, and configured to make a voltage of the first readout bit line SABL be the same as a voltage of the first complementary readout bit line SABLB according to an equalization signal (EQ).

As shown in FIG. 1, the equalization subcircuit 401 includes an equalization MOS transistor <41> provided with a source connected to the first readout bit line SABL, a drain connected to the first complementary readout bit line SABLB, and a gate for receiving the equalization signal EQ.

It should be noted that, the specific connection manner of the "source" and "drain" of each transistor above does not limit this embodiment. In other embodiments, a connection manner in which the "source" is replaced with the "drain", and the "drain" is replaced with the "source" may be used.

After the first control MOS transistor and the second control MOS transistor are turned on based on the control signal, the bias voltage is provided to the gate of the first PMOS transistor and the gate of the second PMOS transistor, the first PMOS transistor is turned on based on the bias voltage, the first signal terminal is electrically connected to the first complementary readout bit line, the first level signal is transmitted to the first complementary readout bit line, the second PMOS transistor is turned on based on the bias voltage, the first signal terminal is electrically connected to the first readout bit line, and the first level signal is transmitted to the first readout bit line, thereby canceling offsets of the PMOS transistors. After the first offset cancellation MOS transistor and the second offset cancellation MOS transistor are turned on based on the offset cancellation signal, the initial bit line and the first complementary readout bit line are electrically connected and share a voltage, the initial complementary bit line and the first readout bit line are electrically connected and share a voltage, the voltage of the initial bit line serves as a gate voltage of the first NMOS transistor for turning on the first NMOS transistor, the second signal terminal is electrically connected to the first complementary readout bit line, the second level signal is transmitted to the first complementary readout bit line, the voltage of the initial complementary bit line serves as a gate voltage of the second NMOS transistor for turning on the second NMOS transistor, the second signal terminal is electrically connected to the first readout bit line, and the second level signal is transmitted to the first readout bit line, thereby canceling offsets of the NMOS transistors. The first PMOS transistor and the second PMOS transistor are turned on based on a stable bias voltage, i.e., keeping the voltage of the first readout bit line and the voltage of the first complementary readout bit line stable, thereby further stabilizing the voltage of the initial bit line and the voltage of the initial complementary bit line, avoiding voltage fluctuations of the bit line and the complementary bit line, and stably canceling an offset noise in the sense amplification circuit.

It should be noted that, in order to highlight the innovative part of the present disclosure, subcircuits that are not closely related to resolving the technical problem proposed by the present disclosure are not introduced in this embodiment, but this does not indicate that there are no other subcircuits in this embodiment. Those skilled in the art can understand that the above embodiments are specific embodiments for implementing the present disclosure. In practical applications, various changes may be made to the above embodiments in terms of forms and details without departing from the spirit and scope of the present disclosure.

Another embodiment of the present disclosure provides a method of reading out data applied to the sense amplification circuit, including: a precharge stage, an offset cancellation stage, a charge sharing stage, a sense amplification stage, and a reset stage performed in sequence; in the precharge stage and the reset stage, precharging an initial bit line, a first readout bit line, a second readout bit line, an initial complementary bit line, a first complementary readout bit line, and a second complementary readout bit line in the sense amplification circuit to a precharge voltage; in the offset cancellation stage, providing a bias voltage to a first PMOS transistor and a second PMOS transistor in the sense amplification circuit for eliminating a device difference between the first PMOS transistor and the second PMOS transistor and eliminating a device difference between a first NMOS transistor and a second NMOS transistor; in the charge sharing stage, reading out a voltage of a target memory cell to the initial bit line, and reading out a voltage of a target complementary memory cell to the initial complementary bit line; and in the sense amplification stage, pulling up a voltage higher than the precharge voltage in the initial bit line and the initial complementary bit line to a voltage corresponding to the first level signal, and pulling down a voltage lower than the precharge voltage in the initial bit line and the initial complementary bit line to a voltage corresponding to the second level signal.

Figure 2:
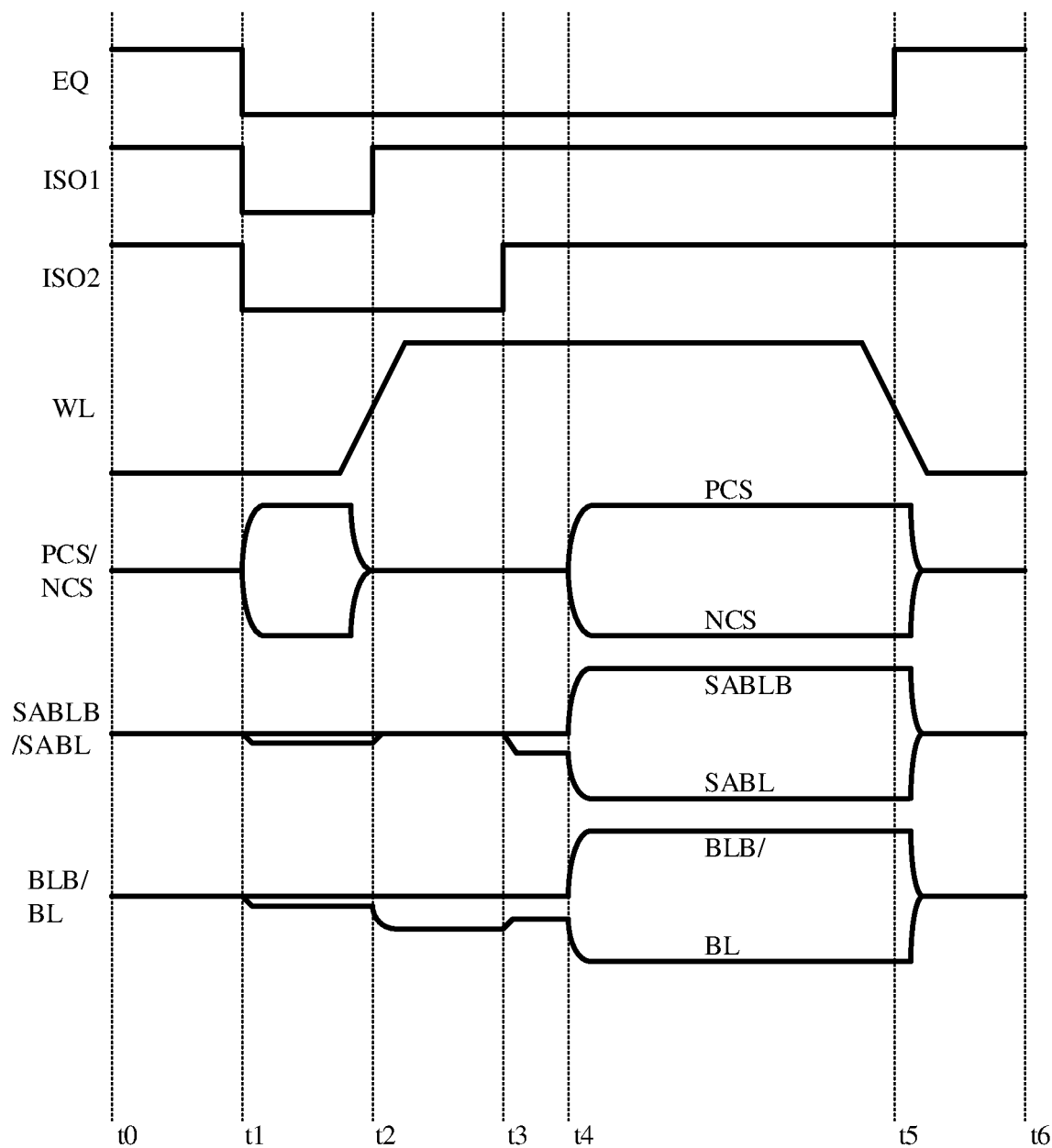
FIG. 2 is a schematic timing diagram of a method of reading out data according to another embodiment of the present disclosure.

FIG. 2 is a schematic timing diagram of a method of reading out data according to this embodiment, FIG. 3 to FIG. 8 are schematic structural diagrams of a sense amplification circuit corresponding to each step of a method of reading out data according to this embodiment, and the details are as follows:

Referring to FIG. 2, the method of reading out data includes a precharge stage, an offset cancellation stage, a charge sharing stage, a sense amplification stage, and a reset stage performed in sequence.

The precharge stage is t0-t1 in FIG. 2, the offset cancellation stage is t1-t2 in FIG. 2, the charge sharing stage is t2-t3 in FIG. 2, the sense amplification stage is t3-t5 in FIG. 2, and the reset stage is t5-t6 in FIG. 2.

Figure 3:
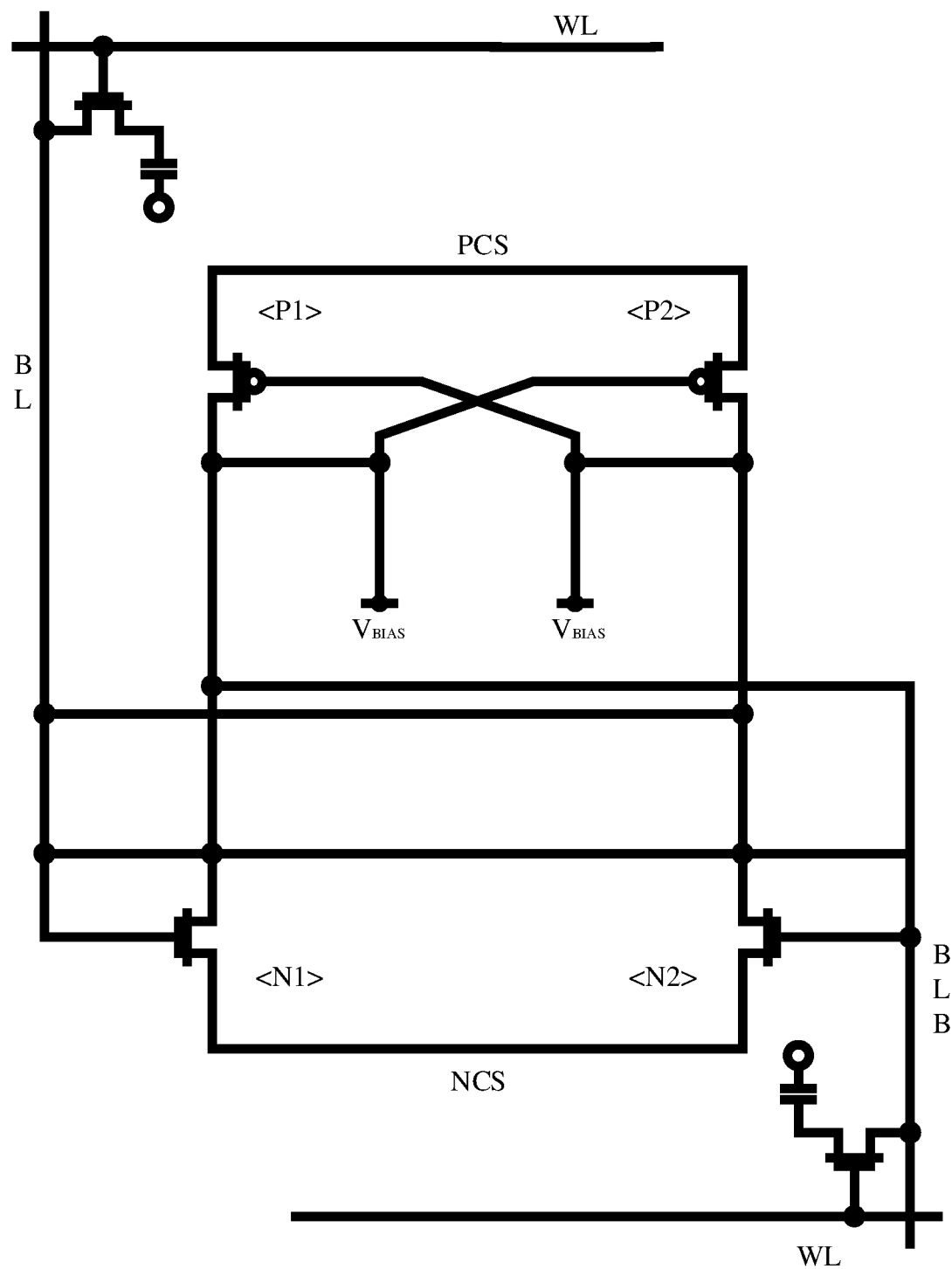
FIG. 3 to FIG. 8 are schematic structural diagrams of a sense amplification circuit corresponding to each step of a method of reading out data according to another embodiment of the present disclosure.

With reference to the part t0-t1 in FIG. 1 and FIG. 2, and in combination with FIG. 3, the precharge stage includes precharging the initial bit line BL, the first readout bit line SABL, the second readout bit line ISABL, the first complementary readout bit line SABLB, and the second complementary readout bit line ISABLB in the sense amplification circuit to a precharge voltage.

The first isolation signal ISO1 is provided for turning on the first isolation MOS transistor <21> to electrically connect the first readout bit line SABL to the second readout bit line ISABL, and is provided for turning on the second isolation MOS transistor <22> to electrically connect the first complementary readout bit line SABLB to the second complementary readout bit line ISABLB.

The second isolation signal ISO2 is provided for turning on the third isolation MOS transistor <23> to electrically connect the initial bit line BL to the first readout bit line SABL, and is provided for turning on the fourth isolation MOS transistor <24> to electrically connect the initial complementary bit line BLB to the first complementary readout bit line SABLB.

The precharge signal is provided to precharge the initial bit line BL and the initial complementary bit line BLB to a preset voltage, or precharge the first readout bit line SABL and the first complementary readout bit line SABLB to a precharge voltage.

In one example, the precharge voltage is ½ of the stored internal supply voltage.

In one example, in the precharge stage, the equalization signal EQ is also provided to electrically connect the first readout bit line SABL to the first complementary readout bit line SABLB.

By electrically connecting the first readout bit line SABL to the second readout bit line ISABL, electrically connecting the first complementary readout bit line SABLB to the second complementary readout bit line ISABLB, electrically connecting the initial bit line BL to the first readout bit line SABL, and electrically connecting the initial complementary bit line BLB to the first complementary readout bit line SABLB, one of the initial bit line BL, the first readout bit line SABL, the second readout bit line ISABL, the first complementary readout bit line SABLB, and the second complementary readout bit line ISABLB is precharged to complete the precharge of the initial bit line BL, the first readout bit line SABL, the second readout bit line ISABL, the first complementary readout bit line SABLB, and the second complementary readout bit line ISABLB.

Figure 4:
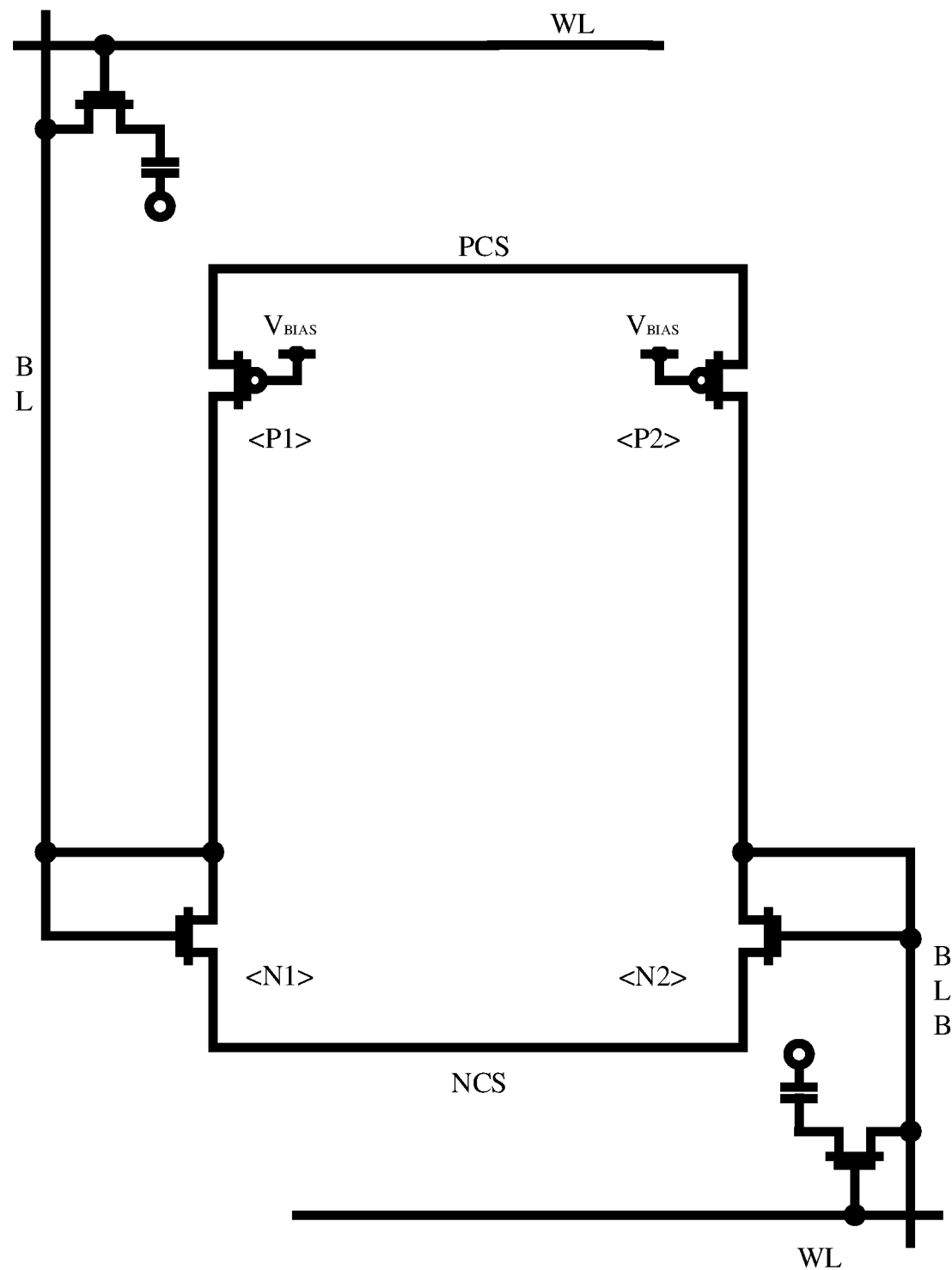

With reference to the part t1-t2 in FIG. 1 and FIG. 2, and in combination with FIG. 4, the offset cancellation stage includes: providing the bias voltage VBIAS to the first PMOS transistor <P1> and the second PMOS transistor <P2> in the sense amplification circuit for eliminating the device difference between the first PMOS transistor <P1> and the second PMOS transistor <P2> and eliminating the device difference between the first NMOS transistor <N1> and the second NMOS transistor <N2>.

Exemplarily, the first level signal PCS is provided to the first signal terminal, and the second level signal NCS is provided to the second signal terminal.

The same bias voltage VBIAS is provided to the gate of the first PMOS transistor <P1> and the gate of the second PMOS transistor <P2>, the voltage of the first complementary readout bit line SABLB is adjusted by the first PMOS transistor <P1> on the basis of the first level signal PCS, and the voltage of the first readout bit line SABL is adjusted by the second PMOS transistor <P2> on the basis of the second level signal NCS.

After the first control MOS transistor <11> and the second control MOS transistor <12> are turned on based on the control signal, the bias voltage VBIAS is provided to the gate of the first PMOS transistor <P1> and the gate of the second PMOS transistor <P2>, the first PMOS transistor <P1> is turned on based on the bias voltage VBIAS, the first signal terminal is electrically connected to the first complementary readout bit line SABLB, the first level signal PCS is transmitted to the first complementary readout bit line SABLB, the second PMOS transistor <P2> is turned on based on the bias voltage VBIAS, the first signal terminal is electrically connected to the first readout bit line SABL, and the first level signal PCS is transmitted to the first readout bit line SABL.

The device difference between the first PMOS transistor <P1> and the second PMOS transistor <P2> is caused by factors such as a forming process, that is, the first PMOS transistor <P1> and the second PMOS transistor <P2> have different threshold voltages, such that after the first PMOS transistor <P1> and the second PMOS transistor <P2> are turned on based on the bias voltage VBIAS, there is a difference between the voltage of the first readout bit line SABL and the voltage of the first complementary readout bit line SABLB.

The offset cancellation signal OC is provided to electrically connect the initial bit line BL to the first complementary readout bit line SABLB and electrically connect the initial complementary bit line BLB to the first readout bit line SABL, the voltage of the first complementary readout bit line SABLB is adjusted by the first NMOS transistor <N1> on the basis of the voltage of the initial bit line BL, and the voltage of the first readout bit line SABL is adjusted by the second NMOS transistor <N2> on the basis of the voltage of the initial complementary bit line BLB.

After the first offset cancellation MOS transistor <31> and the second offset cancellation MOS transistor <32> are turned on based on the offset cancellation signal OC, the initial bit line BL and the first complementary readout bit line SABLB are electrically connected and share a voltage, and the initial complementary bit line BLB and the first readout bit line SABL are electrically connected and share a voltage, such that there is a difference between the initial bit line BL and the initial complementary bit line BLB, thereby canceling offsets in the PMOS transistors.

The voltage of the initial bit line BL is used as a gate voltage of the first NMOS transistor <N1> for turning on the first NMOS transistor <N1>, the second signal terminal is electrically connected to the first complementary readout bit line SABLB, and the second level signal NCS is transmitted to the first complementary readout bit line SABLB. The voltage of the initial complementary bit line BL is used as a gate voltage of the second NMOS transistor <N2> for turning on the second NMOS transistor <N2>, the second signal terminal is electrically connected to the first readout bit line SABL, and the second level signal NCS is transmitted to the first readout bit line SABL.

The device difference between the first NMOS transistor <N1> and the second NMOS transistor <N2> is caused by factors such as a forming process, that is, the first NMOS transistor <N1> and the second NMOS transistor <N2> have different threshold voltages, such that after the first NMOS transistor <N1> and the second NMOS transistor <N2> are turned on, the difference between the voltage of the first readout bit line SABL and the voltage of the first complementary readout bit line SABLB changes.

After the first offset cancellation MOS transistor <31> and the second offset cancellation MOS transistor <32> are turned on based on the offset cancellation signal OC, the initial bit line BL and the first complementary readout bit line SABLB are electrically connected and share a voltage, and the initial complementary bit line BLB and the first readout bit line SABL are electrically connected and share a voltage, such that the difference between the voltage of the first readout bit line SABL and the voltage of the first complementary readout bit line SABLB is changed and synchronized to the initial bit line BL and the initial complementary bit line BLB, thereby canceling offsets in the NMOS transistors.

The first PMOS transistor <P1> and the second PMOS transistor <P2> are turned on based on the stable bias voltage VBIAS, i.e., keeping the voltage of the first readout bit line SABL and the voltage of the first complementary readout bit line SABLB stable, thereby further stabilizing the voltage of the initial bit line BL and the voltage of the initial complementary bit line BLB, avoiding voltage fluctuations on the bit line and the complementary bit line, and stably canceling an offset noise in the sense amplification circuit.

Figure 5:
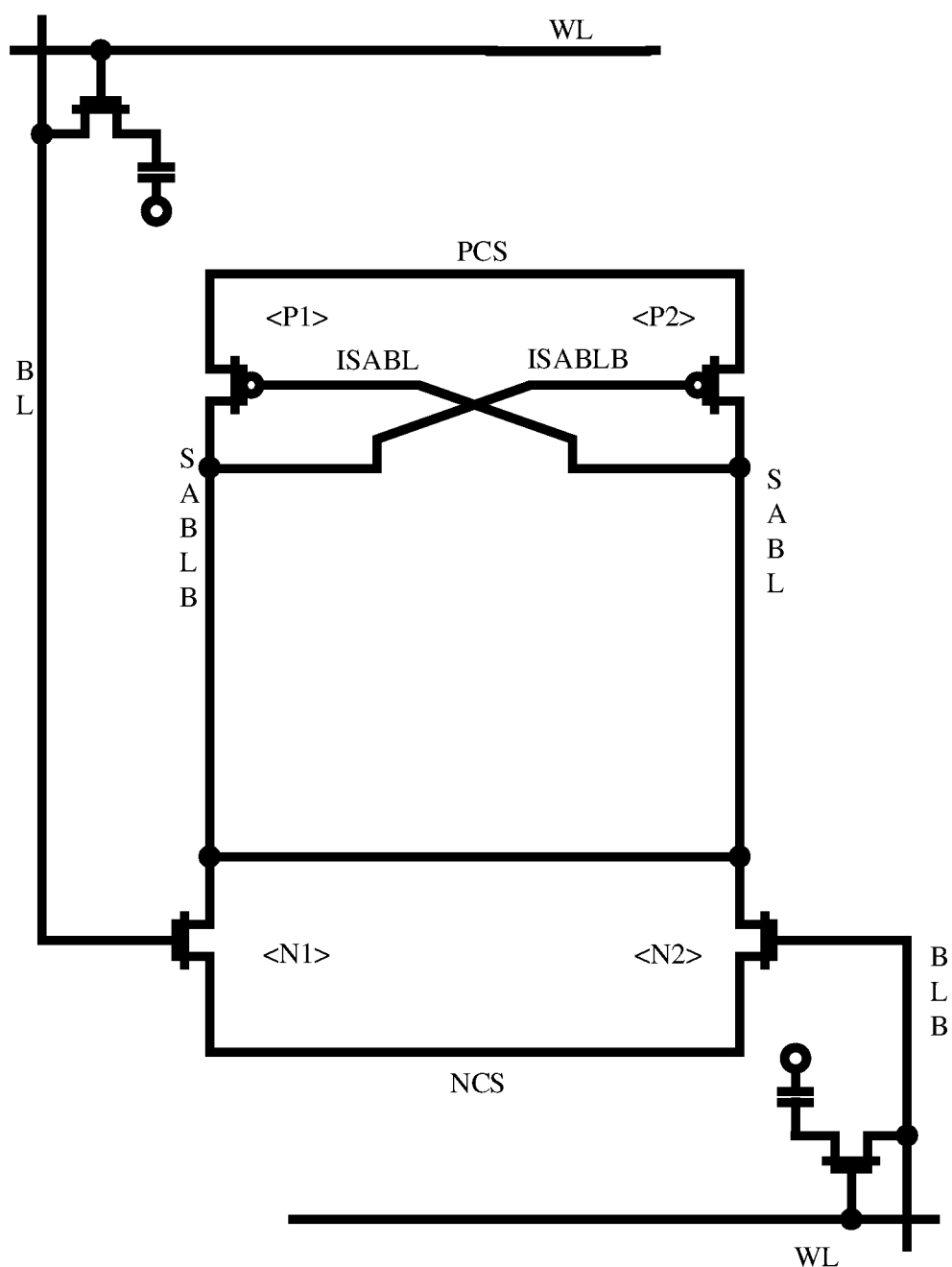

With reference to the part t2-t3 in FIG. 1 and FIG. 2, and in combination with FIG. 5, the charge sharing stage includes: reading out the voltage of the target memory cell to the initial bit line BL, and reading out the voltage of the target complementary memory cell to the initial complementary bit line.

The bit selection signal WL is provided to read out the voltage of the target memory cell to the initial bit line BL, and read out the voltage of the target complementary memory cell to the initial complementary bit line BLB.

The first isolation signal ISO1 is provided for turning on the first isolation MOS transistor <21> to electrically connect the first readout bit line SABL to the second readout bit line ISABL, so as to synchronize the voltage of the first readout bit line SABL to the second readout bit line ISABL. The first isolation signal ISO1 is provided for turning on the second isolation MOS transistor <22> to electrically connect the first complementary readout bit line SABLB to the second complementary readout bit line ISABLB, so as to synchronize the voltage of the first complementary readout bit line SABLB to the second complementary readout bit line ISABLB.

In the charge sharing stage, the second isolation signal ISO2 is not provided. At this time, the initial bit line BL is not electrically connected to the first readout bit line SABL, and the initial complementary bit line BLB is not electrically connected to the first complementary readout bit line SABLB. In this stage, the equalization signal EQ can also be provided to synchronize the voltage of the first readout bit line SABL and the voltage of the first complementary readout bit line SABLB to ensure the accuracy of subsequent data readout.

Figure 6:
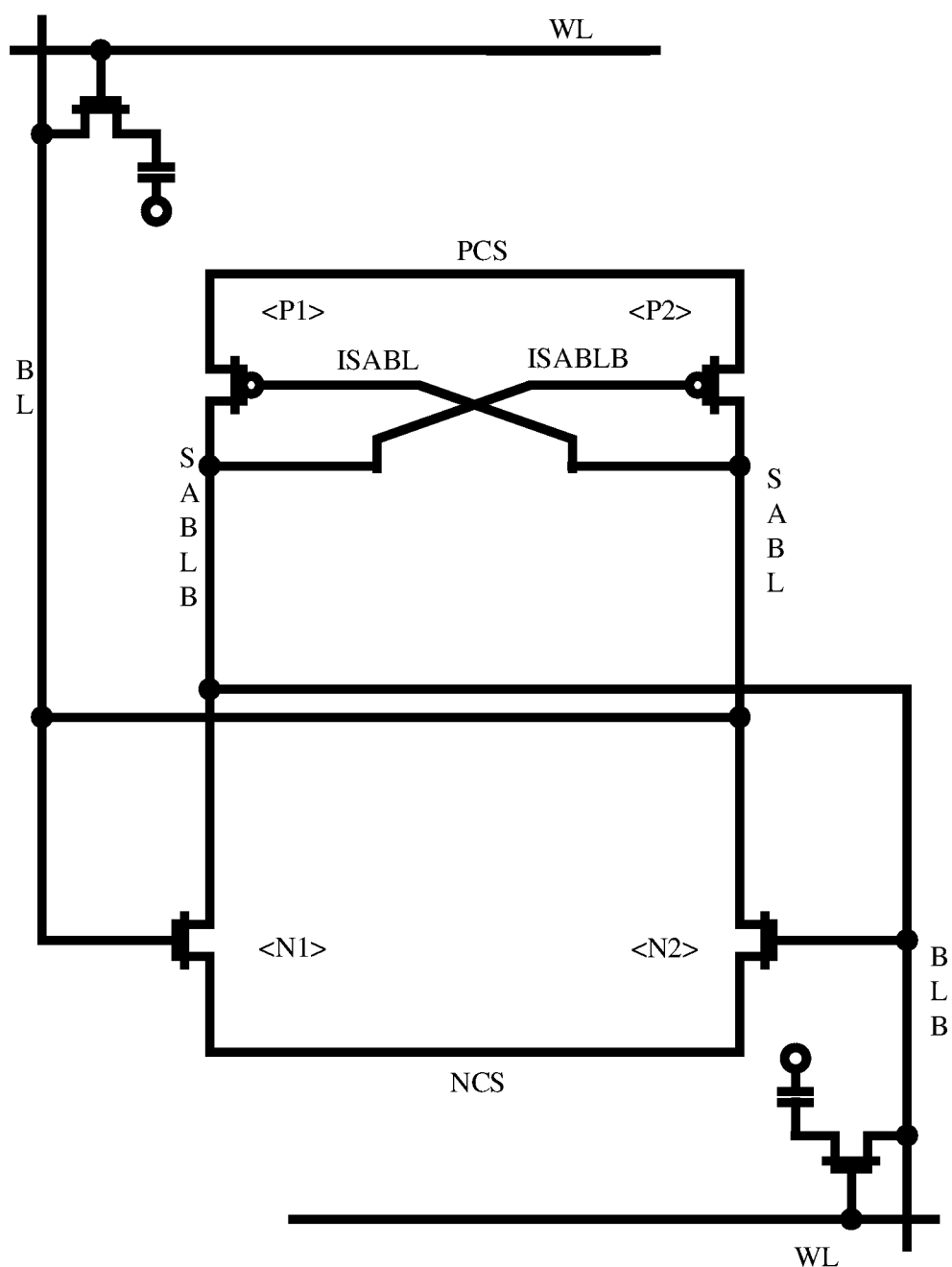
Figure 7:
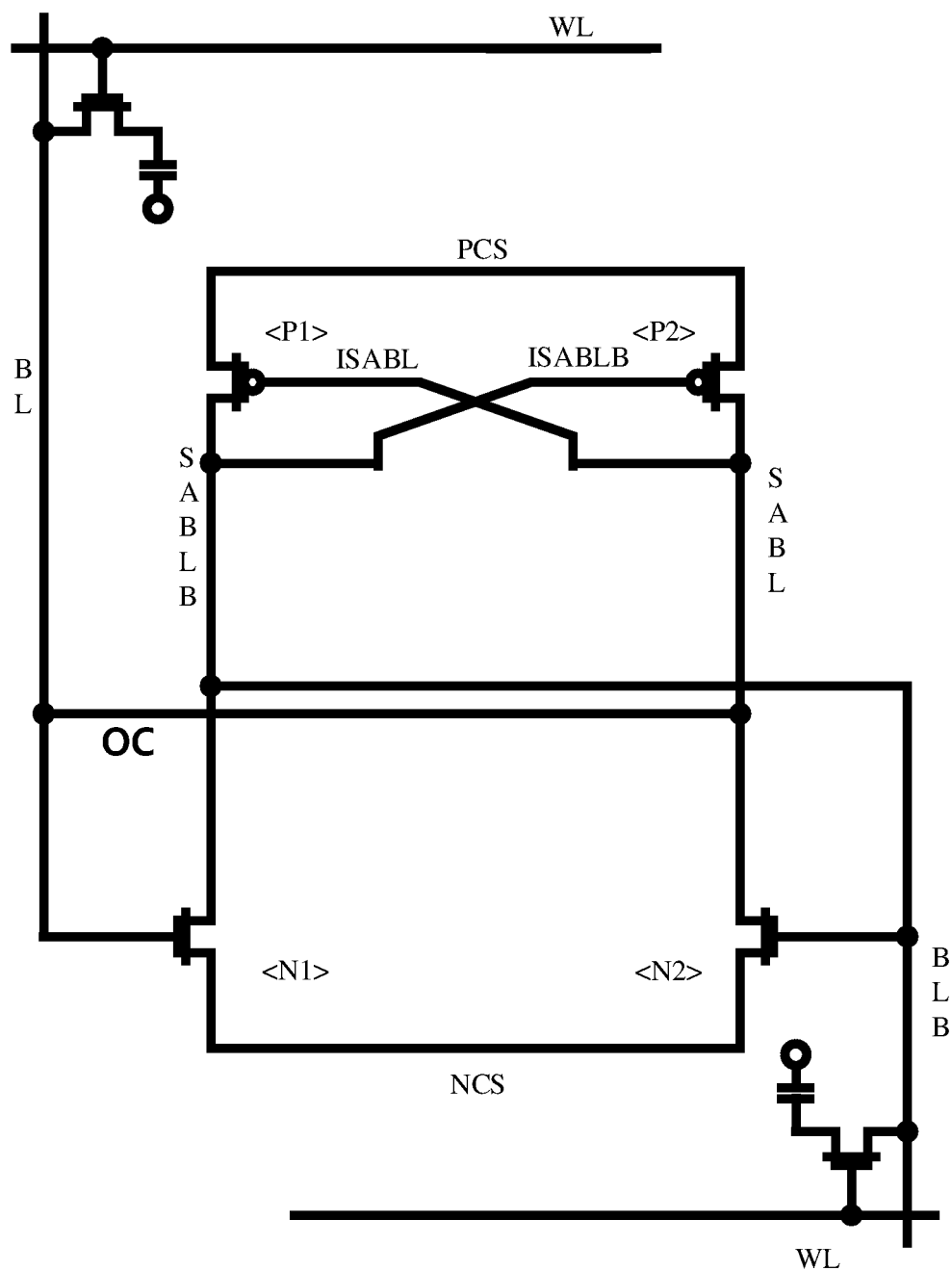

With reference to the part t3-t5 in FIG. 1 and FIG. 2, and in combination with FIG. 6 and FIG. 7, the sense amplification stage includes: pulling up a voltage higher than the precharge voltage in the initial bit line BL and the initial complementary bit line BLB to a voltage corresponding to the first level signal PCS, and pulling down a voltage lower than the precharge voltage in the initial bit line BL and the initial complementary bit line BLB to a voltage corresponding to the second level signal NCS.

Exemplarily, the sense amplification stage includes a pre-sense stage and an amplification stage.

With reference to the part t3-t4 in FIG. 1 and FIG. 2, and in combination with FIG. 6, the pre-sense stage includes: reading out the voltage of the initial bit line BL to the first readout bit line SABL and the second readout bit line ISABL, and reading out the voltage of the initial complementary bit line BLB to the first complementary readout bit line SABLB and the second complementary readout bit line ISABLB.

The second isolation signal ISO2 is provided for turning on the third isolation MOS transistor <23> to electrically connect the initial bit line BL to the first readout bit line SABL, so as to read out the voltage of the initial bit line BL to the first readout bit line SABL. The second isolation signal ISO2 is provided for turning on the fourth isolation MOS transistor <24> to electrically connect the initial complementary bit line BLB to the first complementary readout bit line SABLB, so as to read out the voltage of the initial complementary bit line BLB to the first complementary readout bit line SABLB.

The first isolation signal ISO1 is provided for turning on the first isolation MOS transistor <21> to electrically connect the first readout bit line SABL to the second readout bit line ISABL, so as to synchronize the voltage of the first readout bit line SABL to the second readout bit line ISABL. The first isolation signal ISO1 is provided for turning on the second isolation MOS transistor <22> to electrically connect the first complementary readout bit line SABLB to the second complementary readout bit line ISABLB, so as to synchronize the voltage of the first complementary readout bit line SABLB to the second complementary readout bit line ISABLB.

With reference to the part t4-t5 in FIG. 1 and FIG. 2, and in combination with FIG. 7, the amplification stage includes: pulling up the voltage higher than the precharge voltage in the first readout bit line SABL and the first complementary readout bit line SABLB to a voltage corresponding to the first level signal PCS, and pulling down the voltage lower than the precharge voltage in the first readout bit line SABL and the first complementary readout bit line SABLB to a voltage corresponding to the second level signal NCS, and synchronizing the voltage of the first readout bit line SABL to the initial bit line BL, and synchronizing the voltage of the first complementary readout bit line SABLB to the initial complementary bit line BLB.

The first isolation signal ISO1, the first level signal PCS, and the second level signal NCS are provided, the voltage higher than the precharge voltage is pulled up to a voltage corresponding to the first level signal PCS, and the voltage lower than the precharge voltage is pulled down to a voltage corresponding to the second level signal NCS.

At this time, for the first PMOS transistor <P1> and the first NMOS transistor <N1>, since the connection relationship between the gate of the first PMOS transistor <P1> and the gate of the first NMOS transistor <N1> is the same, that is, when the first PMOS transistor <P1> or the first NMOS transistor <N1> is turned on based on different levels of the second readout bit line ISABL, there is only one MOS transistor that is turned on in the first PMOS transistor <P1> and the first NMOS transistor <N1>; and for the second PMOS transistor <P2> and the second NMOS transistor <N2>, since the connection relationship between the gate of the second PMOS transistor <P2> and the gate of the second NMOS transistor <N2> is the same, that is, when the second PMOS transistor <P2> or the second NMOS transistor <N2> is turned on based on different levels of the second complementary bit line ISABLB, there is only one MOS transistor that is turned on in the second PMOS transistor <P2> and the second NMOS transistor <N2>.

After the first PMOS transistor <P1> is turned on, the first signal terminal is communicated with the first readout bit line SABL, so that the first readout bit line SABL is pulled up to the first level signal PCS, the initial bit line BL is pulled up to the first level signal PCS, and the data read out by the memory through the initial bit line BL is at a high level of the first level signal PCS corresponding to logic "1"; after the first NMOS transistor <N1> is turned on, the second signal terminal is communicated with the first readout bit line SABL, such that the first readout bit line SABL is pulled down to the second level signal NCS, the initial bit line BL is pulled down to the second level signal NCS, and the data read out by the memory through the initial bit line BL is at a low level of the second level signal NCS corresponding to logic "0"; after the second PMOS transistor <P2> is turned on, the first signal terminal is communicated with the first complementary readout bit line SABLB, such that the first complementary readout bit line SABLB is pulled up to the first level signal PCS, the initial complementary bit line BLB is pulled up to the first level signal PCS, and the data read out by the memory through the initial complementary bit line BLB is at a high level of the first level signal PCS corresponding to logic "1"; and after the second NMOS transistor <N2> is turned on, the second signal terminal is communicated with the first complementary readout bit line SABLB, such that the first complementary readout bit line SABLB is pulled down to the second level signal NCS, the initial complementary bit line BLB is pulled down to the second level signal NCS, and the data read out by the memory through the initial complementary bit line BLB is at a low level of the second level signal NCS corresponding to logic "0".

The second isolation signal ISO2 is provided to synchronize the voltage of the first readout bit line SABL to the initial bit line BL, and synchronize the voltage of the first complementary readout bit line SABLB to the initial complementary bit line BLB.

Figure 8:
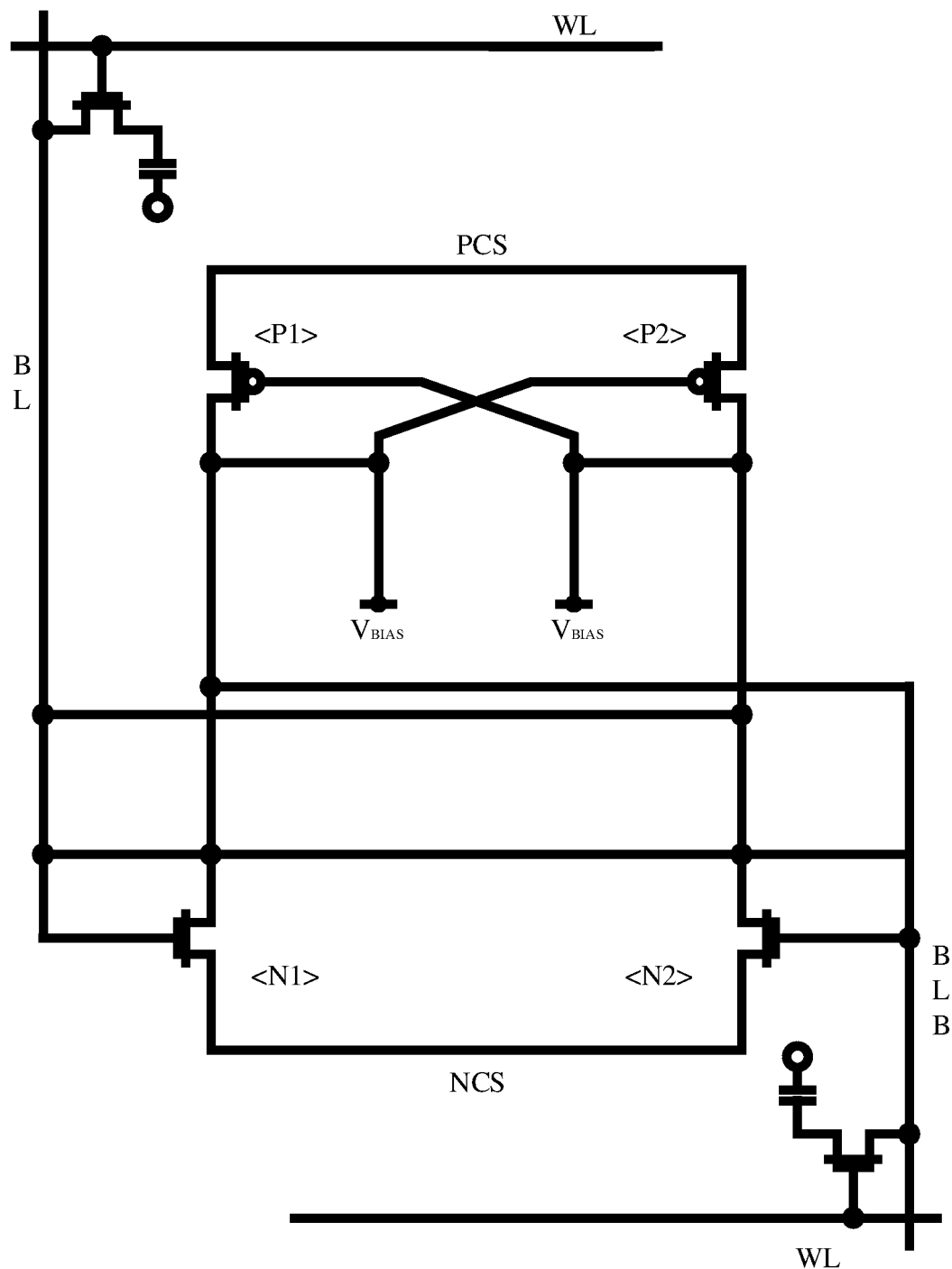

With reference to the part t5-t6 in FIG. 1 and FIG. 2, and in combination with FIG. 8, for the reset stage, namely the reset stage after the amplification is completed, the signal timing and circuit structure thereof are the same as those of the precharge stage, and details are not described herein again.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the sense amplification circuit and the method of reading out data provided by the embodiments of the present disclosure, when the first control MOS transistor and the second control MOS transistor are turned on based on the control signal, the bias voltage is provided to the gate of the first PMOS transistor and the gate of the second PMOS transistor, the first PMOS transistor is turned on based on the bias voltage, the first signal terminal is electrically connected to the first complementary readout bit line, the first level signal is transmitted to the first complementary readout bit line, the second PMOS transistor is turned on based on the bias voltage, the first signal terminal is electrically connected to the first readout bit line, and the first level signal is transmitted to the first readout bit line, thereby canceling offsets of the PMOS transistors. After the first offset cancellation MOS transistor and the second offset cancellation MOS transistor are turned on based on the offset cancellation signal, the initial bit line and the first complementary readout bit line are electrically connected and share a voltage, the initial complementary bit line and the first readout bit line are electrically connected and share a voltage, the voltage of the initial bit line serves as a gate voltage of the first NMOS transistor for turning on the first NMOS transistor, the second signal terminal is electrically connected to the first complementary readout bit line, the second level signal is transmitted to the first complementary readout bit line, the voltage of the initial complementary bit line serves as a gate voltage of the second NMOS transistor for turning on the second NMOS transistor, the second signal terminal is electrically connected to the first readout bit line, and the second level signal is transmitted to the first readout bit line, thereby canceling offsets of the NMOS transistors. The first PMOS transistor and the second PMOS transistor are turned on based on a stable bias voltage, i.e., keeping the voltage of the first readout bit line and the voltage of the first complementary readout bit line stable, thereby further stabilizing the voltage of the initial bit line and the voltage of the initial complementary bit line, avoiding voltage fluctuations of the bit line and the complementary bit line, and stably canceling an offset noise in the sense amplification circuit.

The invention claimed is:

1. A sense amplification circuit, provided between two adjacent memory arrays, and comprising:
   a first positive-channel metal-oxide semiconductor (PMOS) transistor, provided with a gate connected to a second readout bit line, a drain connected to a first complementary readout bit line, and a source connected to a first signal terminal;
   a first negative-channel metal-oxide semiconductor (NMOS) transistor, provided with a gate connected to an initial bit line, a drain connected to the first complementary readout bit line, and a source connected to a second signal terminal, wherein the initial bit line is connected to one of the two adjacent memory arrays;
   a second PMOS transistor, provided with a gate connected to a second complementary readout bit line, a drain connected to a first readout bit line, and a source connected to the first signal terminal;
   a second NMOS transistor, provided with a gate connected to an initial complementary bit line, a drain connected to the first readout bit line, and a source connected to the second signal terminal, wherein the initial complementary bit line is connected to the other of the two adjacent memory arrays,
   the first signal terminal is configured to receive a first level signal, and the second signal terminal is configured to receive a second level signal;
   a first control metal-oxide semiconductor (MOS) transistor, provided with a source connected to the second readout bit line, a gate for receiving a control signal, and a drain for receiving a bias voltage, and configured to provide the bias voltage to the first PMOS transistor according to the control signal;
   a second control MOS transistor, provided with a source connected to the second complementary readout bit line, a gate for receiving the control signal, and a drain for receiving the bias voltage, and configured to provide the bias voltage to the second PMOS transistor according to the control signal;

a first offset cancellation MOS transistor, provided with a source connected to the initial bit line, a drain connected to the first complementary readout bit line, and a gate for receiving an offset cancellation signal, and configured to electrically connect the initial bit line to the first complementary readout bit line according to the offset cancellation signal; and a second offset cancellation MOS transistor, provided with a source connected to the initial complementary bit line, a drain connected to the first readout bit line, and a gate for receiving the offset cancellation signal, and configured to electrically connect the initial complementary bit line to the first readout bit line according to the offset cancellation signal.

2. The sense amplification circuit according to claim 1, wherein the control signal is the same as the offset cancellation signal.

3. The sense amplification circuit according to claim 1, further comprising:

a first isolation subcircuit, provided with one end connected to the first readout bit line and the other end connected to the second readout bit line, and configured to electrically connect the first readout bit line to the second readout bit line according to a first isolation signal; and a second isolation subcircuit, provided with one end connected to the first complementary readout bit line and the other end connected to the second complementary readout bit line, and configured to electrically connect the first complementary readout bit line to the second complementary readout bit line according to the first isolation signal.

4. The sense amplification circuit according to claim 3, wherein the first isolation subcircuit comprises a first isolation MOS transistor; the second isolation subcircuit comprises a second isolation MOS transistor;

the first isolation MOS transistor is provided with a source connected to the first readout bit line, a drain connected to the second readout bit line, and a gate for receiving the first isolation signal; and the second isolation MOS transistor is provided with a source connected to the first complementary readout bit line, a drain connected to the second complementary readout bit line, and a gate for receiving the first isolation signal.

5. The sense amplification circuit according to claim 1, further comprising:

a third isolation subcircuit, provided with one end connected to the initial bit line and the other end connected to the first readout bit line, and configured to electrically connect the initial bit line to the first readout bit line according to a second isolation signal; and a fourth isolation subcircuit, provided with one end connected to the initial complementary bit line and the other end connected to the first complementary readout bit line, and configured to electrically connect the initial complementary bit line to the first complementary readout bit line according to the second isolation signal.

6. The sense amplification circuit according to claim 5, wherein the third isolation subcircuit comprises a third isolation MOS transistor; the fourth isolation subcircuit comprises a fourth isolation MOS transistor;

the third isolation MOS transistor is provided with a source connected to the initial bit line, a drain connected to the first readout bit line, and a gate for receiving the second isolation signal; and the fourth isolation MOS transistor is provided with a source connected to the initial complementary bit line, a drain connected to the first complementary readout bit line, and a gate for receiving the second isolation signal.

7. The sense amplification circuit according to claim 1, further comprising: an equalization subcircuit, provided with one end connected to the first readout bit line and the other end connected to the first complementary readout bit line, and configured to make a voltage of the first readout bit line be the same as a voltage of the first complementary readout bit line according to an equalization signal.

8. The sense amplification circuit according to claim 7, wherein the equalization subcircuit comprises an equalization MOS transistor provided with a source connected to the first readout bit line, a drain connected to the first complementary readout bit line, and a gate for receiving the equalization signal.

9. A method of reading out data, applied to the sense amplification circuit according to claim 1, comprising: a precharge stage, an offset cancellation stage, a charge sharing stage, a sense amplification stage, and a reset stage performed in sequence;

in the precharge stage and the reset stage, precharging an initial bit line, a first readout bit line, a second readout bit line, an initial complementary bit line, a first complementary readout bit line, and a second complementary readout bit line in the sense amplification circuit to a precharge voltage;

in the offset cancellation stage, providing a bias voltage to a first PMOS transistor and a second PMOS transistor in the sense amplification circuit for eliminating a device difference between the first PMOS transistor and the second PMOS transistor and eliminating a device difference between a first NMOS transistor and a second NMOS transistor;

in the charge sharing stage, reading out a voltage of a target memory cell to the initial bit line, and reading out a voltage of a target complementary memory cell to the initial complementary bit line; and in the sense amplification stage, pulling up a voltage higher than the precharge voltage in the initial bit line and the initial complementary bit line to a voltage corresponding to a first level signal, and pulling down a voltage lower than the precharge voltage in the initial bit line and the initial complementary bit line to a voltage corresponding to a second level signal.

10. The method of reading out data according to claim 9, wherein the precharging an initial bit line, a first readout bit line, a second readout bit line, an initial complementary bit line, a first complementary readout bit line, and a second complementary readout bit line in the sense amplification circuit to a precharge voltage comprises:

providing a precharge signal, to precharge the initial bit line and the initial complementary bit line to a preset voltage, or to precharge the first readout bit line and the first complementary readout bit line to the precharge voltage;

providing a first isolation signal, to electrically connect the first readout bit line to the second readout bit line, and to electrically connect the first complementary readout bit line to the second complementary readout bit line; and providing a second isolation signal, to electrically connect the initial bit line to the first readout bit line, and to electrically connect the initial complementary bit line to the first complementary readout bit line.

11. The method of reading out data according to claim 9, wherein the providing a bias voltage to a first PMOS transistor and a second PMOS transistor in the sense amplification circuit comprises:
  providing the first level signal to a first signal terminal, and providing the second level signal to a second signal terminal;
  providing a same bias voltage to a gate of the first PMOS transistor and a gate of the second PMOS transistor, adjusting a voltage of the first complementary readout bit line by the first PMOS transistor on a basis of the first level signal, and adjusting a voltage of the first readout bit line by the second PMOS transistor on a basis of the second level signal; and
  providing an offset cancellation signal, to electrically connect the initial bit line to the first readout bit line, and to electrically connect the initial complementary bit line to the first complementary readout bit line, adjusting the voltage of the first complementary readout bit line by the first NMOS transistor on a basis of a voltage of the initial bit line, and adjusting the voltage of the first readout bit line by the second NMOS transistor on a basis of a voltage of the initial complementary bit line.

12. The method of reading out data according to claim 9, wherein the in the charge sharing stage, reading out a voltage of a target memory cell to the initial bit line, and reading out a voltage of a target complementary memory cell to the initial complementary bit line comprises:
  providing a bit selection signal, to read out the voltage of the target memory cell to the initial bit line, and to read out the voltage of the target complementary memory cell to the initial complementary bit line; and
  providing a first isolation signal, to synchronize a voltage of the first readout bit line to the second readout bit line, and to synchronize a voltage of the first complementary readout bit line to the second complementary readout bit line.

13. The method of reading out data according to claim 9, wherein the sense amplification stage comprises a pre-sense stage and an amplification stage performed in sequence;
  in the pre-sense stage, reading out a voltage of the initial bit line to the first readout bit line and the second readout bit line, and reading out a voltage of the initial complementary bit line to the first complementary readout bit line and the second complementary readout bit line; and
  in the amplification stage, pulling up a voltage higher than the precharge voltage in the first readout bit line and the first complementary readout bit line to the voltage corresponding to the first level signal, and pulling down a voltage lower than the precharge voltage in the first readout bit line and the first complementary readout bit line to the voltage corresponding to the second level signal, and synchronizing a voltage of the first readout bit line to the initial bit line, and synchronizing a voltage of the first complementary readout bit line to the initial complementary bit line.

14. The method of reading out data according to claim 13, wherein the reading out a voltage of the initial bit line to the first readout bit line and the second readout bit line, and reading out a voltage of the initial complementary bit line to the first complementary readout bit line and the second complementary readout bit line comprises:
  providing a second isolation signal, to read out the voltage of the initial bit line to the first readout bit line, and to read out the voltage of the initial complementary bit line to the first complementary readout bit line; and
  providing a first isolation signal, to synchronize the voltage of the first readout bit line to the second readout bit line, and to synchronize the voltage of the first complementary readout bit line to the second complementary readout bit line.

15. The method of reading out data according to claim 13, wherein the pulling up a voltage higher than the precharge voltage in the first readout bit line and the first complementary readout bit line to the voltage corresponding to the first level signal, and pulling down a voltage lower than the precharge voltage in the first readout bit line and the first complementary readout bit line to the voltage corresponding to the second level signal, and synchronizing a voltage of the first readout bit line to the initial bit line, and synchronizing a voltage of the first complementary readout bit line to the initial complementary bit line comprises:
  providing a first isolation signal, the first level signal, and the second level signal, pulling up the voltage higher than the precharge voltage to the voltage corresponding to the first level signal, and pulling down the voltage lower than the precharge voltage to the voltage corresponding to the second level signal; and
  providing a second isolation signal, to synchronize the voltage of the first readout bit line to the initial bit line, and to synchronize the voltage of the first complementary readout bit line to the initial complementary bit line.

* * * * *

UNITED STATES PATENT AND TRADEMARK OFFICE
CERTIFICATE OF CORRECTION

| | | |
|---|---|---|
| PATENT NO. | : 11,581,034 B1 | Page 1 of 1 |
| APPLICATION NO. | : 17/818110 | |
| DATED | : February 14, 2023 | |
| INVENTOR(S) | : Chi | |

It is certified that error appears in the above-identified patent and that said Letters Patent is hereby corrected as shown below:

On the Title Page

Item (73) Please insert: --CHANGXIN MEMORY TECHNOLOGIES, INC., HEFEI (CN)--

Signed and Sealed this
Twenty-second Day of August, 2023

Katherine Kelly Vidal
*Director of the United States Patent and Trademark Office*